United States Patent
Choi

(10) Patent No.: US 9,354,276 B2
(45) Date of Patent: May 31, 2016

(54) APPARATUS AND METHOD FOR DETECTING FAILURE OF SWITCHING DEVICE IN INVERTER

(71) Applicant: LSIS CO., LTD., Anyang-si, Gyeonggi-do (KR)

(72) Inventor: Gi Young Choi, Seongnam (KR)

(73) Assignee: LSIS CO., LTD., Anyang-si (KR)

( * ) Notice: Subject to any disclaimer, the term of this patent is extended or adjusted under 35 U.S.C. 154(b) by 364 days.

(21) Appl. No.: 13/727,362

(22) Filed: Dec. 26, 2012

(65) Prior Publication Data

US 2013/0169288 A1 Jul. 4, 2013

(30) Foreign Application Priority Data

Dec. 30, 2011 (KR) .......................... 10-2011-0146781

(51) Int. Cl.
 *G01R 31/327* (2006.01)
 *H02M 1/32* (2007.01)
 *G01R 31/42* (2006.01)
 *H02H 7/122* (2006.01)

(52) U.S. Cl.
 CPC .............. *G01R 31/327* (2013.01); *G01R 31/42* (2013.01); *H02H 7/1225* (2013.01); *H02M 1/32* (2013.01)

(58) Field of Classification Search
 CPC ..................................................... G01R 31/327
 See application file for complete search history.

(56) References Cited

U.S. PATENT DOCUMENTS

| 5,969,966 A | 10/1999 | Sawa et al. |
| 8,319,490 B2 * | 11/2012 | Viitanen ..................... 324/76.53 |
| 2004/0263113 A1 | 12/2004 | Kim |
| 2009/0009920 A1 * | 1/2009 | Yamada ........................ 361/93.1 |
| 2011/0248657 A1 * | 10/2011 | Endoh ....................... 318/400.22 |

FOREIGN PATENT DOCUMENTS

| CN | 2516981 | 10/2002 |
| CN | 1992499 | 7/2007 |
| CN | 101453187 | 6/2009 |
| CN | 101714848 | 5/2010 |
| CN | 101963655 | 2/2011 |
| JP | 2005-181167 | 7/2005 |
| KR | 2010-0013730 | 2/2010 |

OTHER PUBLICATIONS

Machine translation of a reference on IDS filed Aug. 29, 2013—JP2005-181167, Sanyo Electric Co.—Jul. 7, 2005.*
The State Intellectual Property Office of the People's Republic of China Application Serial No. 201210590451.6, Office Action dated Dec. 2, 2014, 5 pages.
Korean Intellectual Property Office Application Serial No. 10-2011-0146781, Office Action dated May 22, 2013, 4 pages.

* cited by examiner

*Primary Examiner* — Jeff Natalini
(74) *Attorney, Agent, or Firm* — Lee, Hong, Degerman, Kang & Waimey; Jonathan Kang; Harry Lee

(57) ABSTRACT

Disclosed is an apparatus and method for detecting failure of a switching device in an inverter, the method including detecting a maximum value and a minimum value of a phase current inputted into a motor from synchronous angle information of the motor through a switching device in a predetermined leg of the inverter unit, and detecting failure of the switching device of the leg through an asymmetry ratio of the phase current.

7 Claims, 5 Drawing Sheets

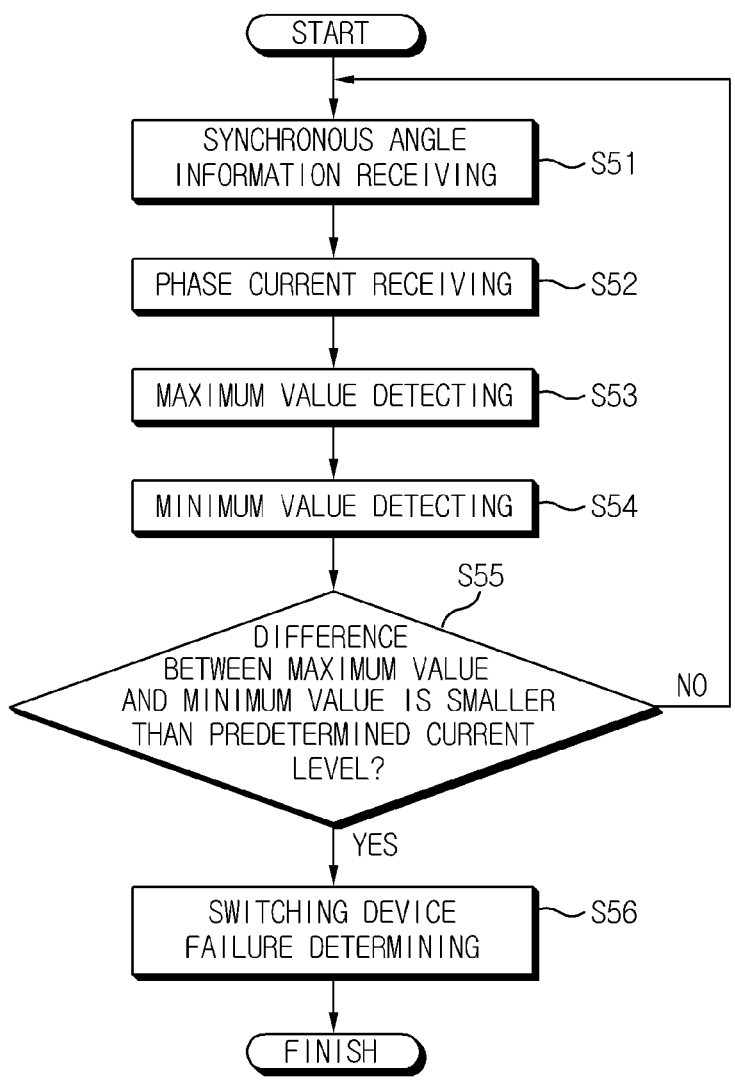

APPARATUS AND METHOD FOR DETECTING FAILURE OF SWITCHING DEVICE IN INVERTER

CROSS-REFERENCE TO RELATED APPLICATIONS

Pursuant to 35 U.S.C. §119 (a), this application claims the benefit of earlier filing date and right of priority to Korean Patent Application No. 10-2011-0146781, filed on Dec. 30, 2011, the contents of which are hereby incorporated by reference herein in their entirety.

BACKGROUND OF THE DISCLOSURE

1. Field of Endeavor

The present disclosure relates to an apparatus and method for detecting failure of switching device in inverter.

2. Background

This section provides background information related to the present disclosure which is not necessarily prior art.

Generally, an inverter is a device used for motor control. FIG. 1 illustrates a schematic view illustrating an inverter according to prior art.

Referring to FIG. 1, a conventional inverter (100) for controlling a motor (200) includes a rectifying unit (110) converting an inputted 3-phase AC power source to a DC power source, a smoothing unit (120) smoothing a pulsation component of a DC voltage outputted from the rectifying unit (110) and an inverter unit (130) converting the DC voltage outputted from the smoothing unit (120) to an AC voltage and providing the AC voltage to the motor (200).

The thus-mentioned inverter (100) is such that a diode in the rectifying unit (110) is formed by a bridge coupling, the smoothing unit (120) is formed with a capacitor, and the inverter unit (130) is used by being connected with a plurality of switching elements. Recently, an IGBT (insulated Gate Bipolar Transistor) excellent in characteristics as a switching element has been widely used.

As noted from the foregoing, the inverter (100) is complicatedly comprised of a plurality of elements, such that if anything happens on the inverter (100), there is no way of visually checking the issues to make it difficult to detect a defected portion.

Particularly, a switching element in the inverter unit (100) is where the failure frequency is the highest, and in order to check the failure of the switching element, a multi-tester was conventionally employed to determine the failure by measuring each resistance of the switching element, which disadvantageously takes too many hours to check or detect the failure.

In order to solve the aforementioned problems, a failure detection device has been disclosed as shown in FIG. 2 which is a schematic circuit diagram illustrating a failure detection device in a switching element (device) according to prior art.

Referring to FIG. 2, a conventional switching element failure detection device (300) is connected to the inverter (100) to prevent an input voltage from being applied to an input terminal of the inverter (100), whereby connection to an output terminal is also disconnected to the motor (200).

As noted from the foregoing, the conventional switching element failure detection device (300) is conceived by the fact that, in a case a failure happens on an IGBT which is a switching element due to over current, a short-circuit occurs in advance in an inner circuit of the IGBT, and an open phenomenon is generated by the over current, whereby an occurrence of open phenomenon in the IGBT is detected.

That is, a gate pulse generating unit (320) sequentially applies a gate pulse to each of the IGBT elements, and determination is made that a failure has occurred to the relevant IGBT, in a case a phase voltage outputted from a relevant IGBT element is not high.

However, the conventional switching element failure detection device (300) suffers from disadvantages in that the inverter (100) and the motor (200) must be stopped to determine the failure to consume an additional time for failure detection, and a separate hardware is required for failure detection of the switching elements to increase the size of the system.

In order to solve the disadvantages, attempts have been made to realize the failure detection of the switching element by way of software. Although configuration is not shown in the inverter (100) in FIG. 1, output currents are periodically measured from a current sensor detecting an output current outputted to the motor (200), an average of the output currents is obtained, and in a case the average is zero (0), it is determined that the switching element is normal, and in a case the average is not zero, it is determined that the switching element is abnormal.

However, the abovementioned prior art also suffers from disadvantages in that it takes many hours to detect the failure, because output currents are sensed from a plurality of points of an AC current (sine waveform) in a period and an average is obtained therefrom.

SUMMARY OF THE DISCLOSURE

This section provides a general summary of the disclosure, and is not a comprehensive disclosure of its full scope or all of its features.

Methods and systems consistent with the present disclosure provide an apparatus for detecting failure of a switching device in an inverter configured to easily detect a failure of a switching device in an inverter, and a method thereof.

It should be emphasized, however, that the present disclosure is not limited to a particular disclosure as explained above. It should be understood that other technical subjects not mentioned herein may be appreciated by those skilled in the art.

In one general aspect of the present disclosure, there is provided an apparatus for detecting failure of a switching device in an inverter, the apparatus comprising: an angle sensor configured to measure a synchronous angle of a motor; a current sensor configured to measure a phase current inputted to the motor through a switching device in a predetermined leg of an inverter unit; and a controller configured to determine a failure of the switching device by determining an asymmetry ratio of the phase current using synchronous angle information of the angle sensor.

In some exemplary embodiments, the controller may detect a maximum value and a minimum value of the phase current using the synchronous angle.

In some exemplary embodiments, the apparatus may further comprise: a storage configured to store the maximum value and the minimum value of the phase current.

In some exemplary embodiments, the controller may determine the failure of the switching device of the leg, in a case a difference between the maximum value and the minimum value of the phase current is substantially smaller than a predetermined level.

In another general aspect of the present disclosure, there is provided a method for detecting failure of switching device in an inverter, the method comprising: detecting a maximum value and a minimum value of a phase current inputted into a motor from synchronous angle information of the motor through a switching device in a predetermined leg of an inverter unit; and detecting failure of the switching device of the leg through an asymmetry ratio of the phase current.

In some exemplary embodiments, the method may further comprise: storing the maximum value and the minimum value of the phase current.

In some exemplary embodiments, the detecting step may include determining the failure of the switching device of the leg, in a case a difference between the maximum value and the minimum value of the phase current is substantially smaller than a predetermined level.

In some exemplary embodiments, the method may further comprise: displaying that the failure of the switching device in the inverter unit has been detected.

The apparatus and method for detecting failure of a switching device in an inverter according to exemplary embodiments of the present disclosure has an advantageous effect in that hardware is dispensed with to enable a quick measure in a case a failure is generated on a switching device of an inverter unit.

BRIEF DESCRIPTION OF THE DRAWINGS

In order to explain the principle of the present disclosure, some accompanying drawings related to its preferred embodiments are below reported for the purpose of illustration, exemplification and description, although they are not intended to be exhaustive. The drawing figures depict one or more exemplary embodiments in accord with the present concepts, by way of example only, not by way of limitations. In the figures, like reference numerals refer to the same or similar elements.

Thus, a wide variety of potential practical and useful embodiments will be more readily understood through the following detailed description of certain exemplary embodiments, with reference to the accompanying exemplary drawings in which:

FIG. 5 is a flowchart illustrating a method for detecting failure of switching device in an inverter according to an exemplary embodiment of the present disclosure.

DETAILED DESCRIPTION

Features and advantages of the disclosed embodiments will be or will become apparent to one of ordinary skill in the art upon examination of the following figures and detailed description. It is intended that all such additional features and advantages be included within the scope of the disclosed embodiments, and protected by the accompanying drawings. Further, the illustrated figures are only exemplary and not intended to assert or imply any limitation with regard to the environment, architecture, or process in which different embodiments may be implemented. Accordingly, the described aspect is intended to embrace all such alterations, modifications, and variations that fall within the scope and novel idea of the present invention.

Meantime, there may be many reasons of failure in a driving system of a motor. Particularly, in a case a motor driving system is operated in association with other parts as in an electric vehicle, a process of determining a reason of failure is further complicated to make it difficult to determine an accurate reason of failure.

Furthermore, a switching device in an inverter unit is positioned at an inside of an inverter, and failure is not occasionally shown on the surface, to make it more difficult to determine the reason of failure. However, the present disclosure enables an easy and selective determination of failure in a switching device.

Hereinafter, an apparatus and method for detecting failure of a switching device in an inverter according to exemplary embodiments of the present disclosure will be described in detail with reference to the accompanying drawings.

Figure 1:
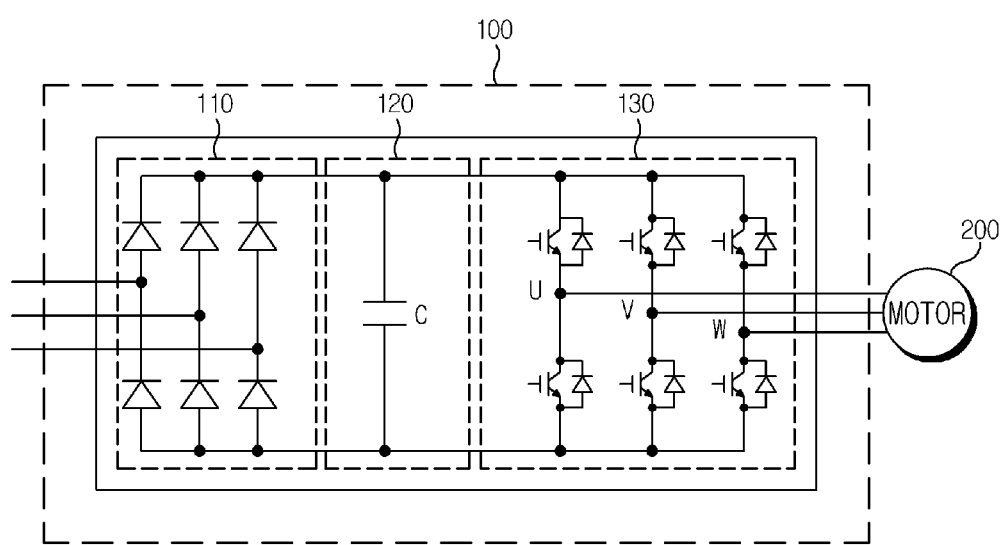
FIG. 1 illustrates a schematic view illustrating an inverter according to prior art.
Figure 2:
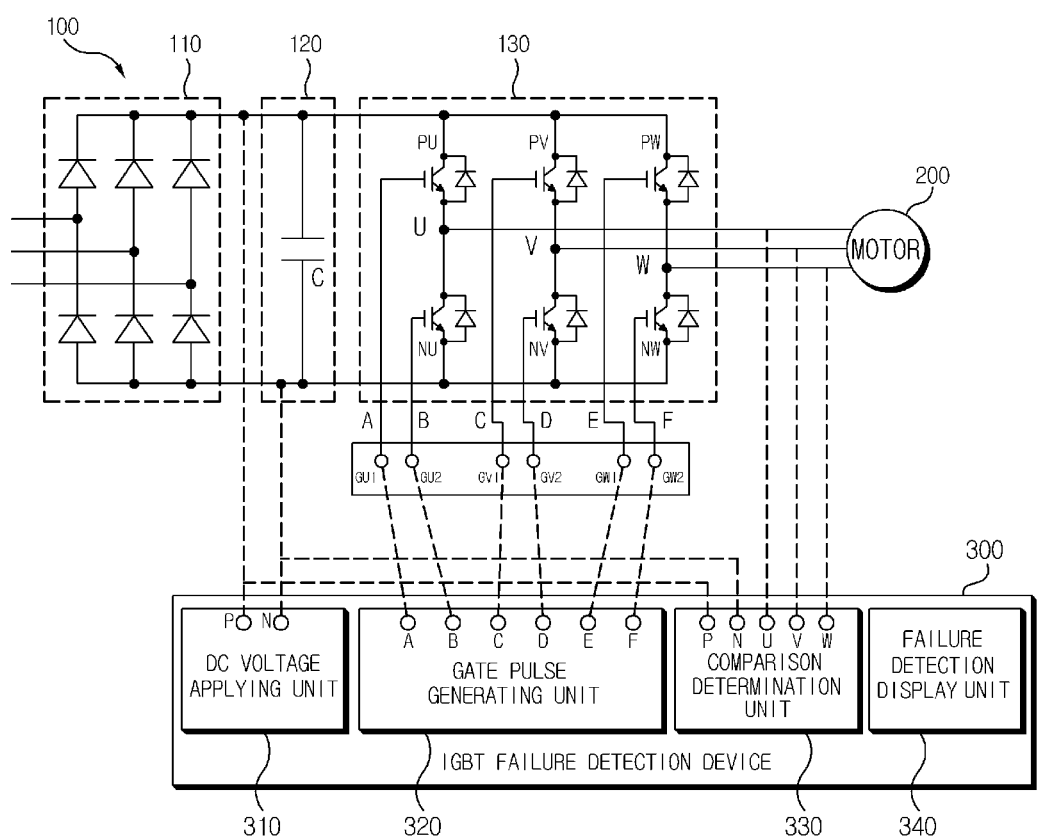
FIG. 2 is a schematic circuit diagram illustrating a failure detection device in a switching element (device) according to prior art.
Figure 3:
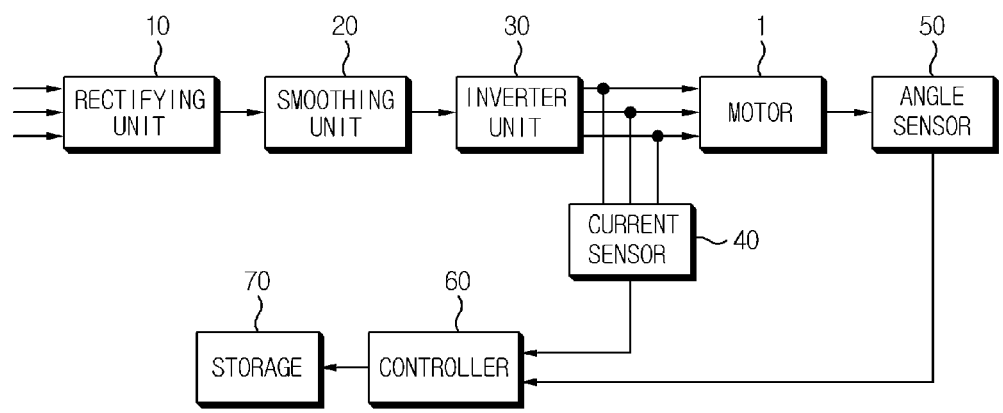
FIG. 3 is a schematic block diagram illustrating an apparatus for detecting failure (abbreviated to failure detection apparatus, or just apparatus) in a switching device according to an exemplary embodiment of the present disclosure.

FIG. 3 is a schematic block diagram illustrating an apparatus for detecting failure (abbreviated to failure detection apparatus, or just apparatus) of a switching device in an inverter according to an exemplary embodiment of the present disclosure.

Referring to FIG. 3, the apparatus according to the present disclosure comprises a current sensor (40), an angle sensor (50), a controller (60) and storage (70). The apparatus according to the present disclosure is intended to detect a failure in a switching device of an inverter unit (30) in an inverter system including a rectifying unit (10), a smoothing unit (20) and the inverter unit (30).

The rectifying unit (10) serves to convert an inputted 3-phase AC power source to a DC power source, the smoothing unit (20) functions to smooth a pulsation component in a DC voltage, and the inverter unit (30) serves to convert the DC voltage outputted from the smoothing unit (20) to a 3-phase AC voltage and provide a converted 3-phase AC voltage to a motor (1).

As explained before, a switching device of the inverter unit (30) generally includes IGBT. However, a switching device applied to the present disclosure is not limited thereto.

The current sensor (40) measures a phase current inputted to the motor (1). The voltage supplied to the motor (1) form the inverter unit (30) is an AC voltage of sine wave. Thus, the phase current measured by the current sensor (40) may be also a sine wave. Furthermore, the angle sensor (50) measures a synchronous angle of the motor (1).

The controller (60) receives a phase current inputted from the current sensor (40) to the motor (1) through a switching device of a predetermined leg, and receives synchronous angle information of the motor (1) from the angle sensor (50) to determine an asymmetry ratio of a phase current inputted through a switching device of a relevant leg.

That is, the controller (60) detects a maximum value of the phase current from the synchronous angle information and detects a minimum value of the phase current from the synchronous angle information. The controller (60) may store the maximum value and the minimum value in the storage (70), which is due to the fact that the maximum value and the minimum value of the phase current are not simultaneously detected.

Then, the storage (70) obtains a difference between the maximum value and the minimum value and determines that the switching device of the relevant leg is properly operated, if the difference is greater than or equal to the predetermined level.

Meanwhile, if the difference is smaller than the predetermined level, it is determined that the switching device of the relevant leg is not properly operated to generate an asymmetry of the phase current, where failure in the switching device of the relevant leg is detected.

At this time, the predetermined level is a value for determining the asymmetry of the phase current, and may be selected based on types of the motor (1) and operation conditions.

Figure 4A:
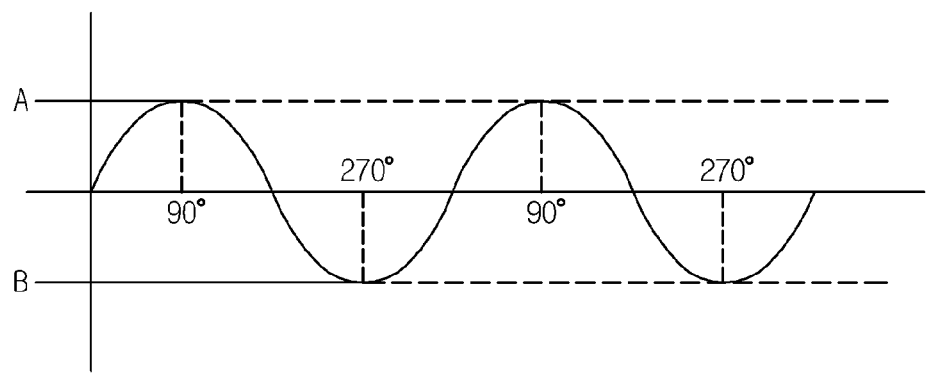
FIG. 4a is a schematic view illustrating a phase current inputted into a motor, in a case a switching device in an inverter is normal.
Figure 4B:
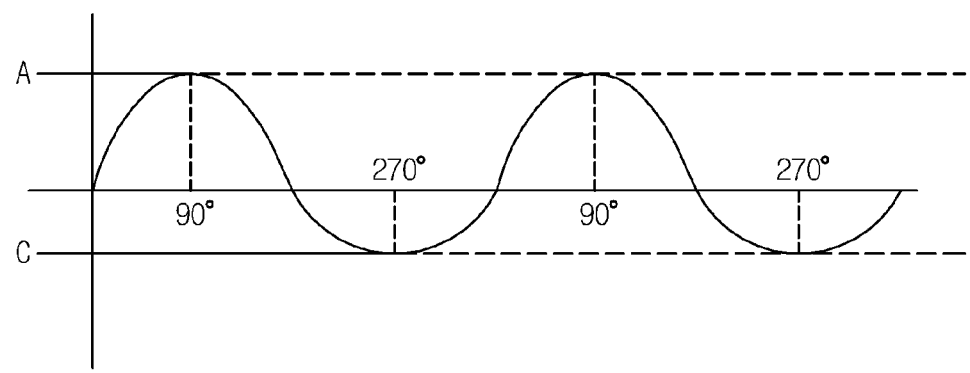
FIG. 4b is a schematic view illustrating a phase current inputted into a motor, in a case a switching device in an inverter is abnormal.

FIG. 4a is a schematic view illustrating a phase current inputted into a motor through a relevant switching device, in a case a switching device in an inverter is normal, and FIG. 4b is a schematic view illustrating a phase current inputted into a motor through a relevant switching device, in a case a switching device in an inverter is abnormal.

Generally, in a case the switching device is in a normal state as in FIG. 4a, a phase current inputted to the motor (1) through the switching device is a sine wave, such that a maximum value of 'A' is outputted, in a case a synchronous angle of the motor (1) is 90°, and a minimum value of 'B' is outputted, in a case a synchronous angle of the motor (1) is 270°, where it can be learned therefrom that 'A' and 'B' are symmetrical.

However, in a case the switching device is in a failure state as in FIG. 4b, a phase current inputted to the motor (1) through the switching device is changed to being asymmetrical. By way of non-limiting example, even if the synchronous angle of the motor (1) is 270°, 'C' may be outputted that is greater in size than the minimum value 'B'. Although not illustrated, the reverse case may be explained, where in a case an synchronous angle is 90°, a value smaller in size than the maximum value of 'A' may be outputted.

Thus, the controller (60) of the present disclosure determines that symmetry of the sine wave has changed to asymmetry if a difference between the maximum value and the minimum value is smaller than a predetermined value to detect a failure of the switching device of a relevant leg.

FIG. 5 is a flowchart illustrating a method for detecting failure of switching device in an inverter according to an exemplary embodiment of the present disclosure.

Referring to FIG. 5, the controller (60), in the method for detecting failure of switching device in an inverter according to an exemplary embodiment of the present disclosure, receives synchronous angle information of the motor (1) detected by the angle sensor (50) (S51), and receives a phase current of a switching device of a predetermined leg inputted to the motor (1) detected by the current sensor (40) (S52).

Although it is explained that the synchronous angle information is received before the phase current is received, it should be apparent to the skilled in the art that the phase current may be received before the synchronous angle information is received, or the synchronous angle information and the phase current may be simultaneously received.

The controller (60) uses the received synchronous angle information of the motor (1) to detect a maximum value of the phase current (S53), and detects a minimum value of the phase current (S54). The detected maximum value and the minimum value of the phase current may be stored in the storage (70) (not shown).

Thereafter, in a case a difference between the detected maximum value and the minimum value of the phase current is greater than or equal to a predetermined level, (S55), it is determined by the controller (60) that the switching device of a relevant leg is in a normal state.

However, in a case the difference between the detected maximum value and the minimum value of the phase current is smaller than the predetermined level, (S56), the controller (60) determines that the switching device of a relevant leg has developed a failure (S56), and informs a user the development of failure by way of a predetermined method (e.g., display) (not shown).

The above-mentioned apparatus and method for detecting failure of a switching device in an inverter according to exemplary embodiments of the present disclosure may, however, be embodied in many different forms and should not be construed as limited to the embodiment set forth herein. Thus, it is intended that embodiment of the present disclosure may cover the modifications and variations of this disclosure provided they come within the scope of the appended claims and their equivalents. While particular features or aspects may have been disclosed with respect to several embodiments, such features or aspects may be selectively combined with one or more other features and/or aspects of other embodiments as may be desired.

What is claimed is:

1. An apparatus for detecting failure of a switching device in an inverter, the apparatus comprising:
   an angle sensor configured to measure a synchronous angle of a motor;
   a current sensor configured to measure a phase current inputted to the motor through a switching device in a predetermined leg of an inverter unit; and
   a controller configured to:
     detect a maximum value of the phase current at a first synchronous angle and detect a minimum value of the phase current at a second synchronous angle, wherein the first synchronous angle and the second synchronous angle are π degrees apart; and
     determine failure of the switching device in the predetermined leg by determining an asymmetry ratio of the maximum value and the minimum value on a single phase of the phase current.

2. The apparatus of claim 1, further comprising:
   a storage configured to store the maximum value and the minimum value of the phase current.

3. The apparatus of claim 1, wherein the controller is further configured to determine the failure of the switching device when a difference between the maximum value and the minimum value is smaller than a predetermined level.

4. A method for detecting failure of a switching device in an inverter, the method comprising:
   detecting a maximum value and a minimum value of a phase current inputted into a motor through a switching device in a predetermined leg of an inverter unit based on synchronous angle information of the motor, the maximum value detected at a first synchronous angle and the minimum value detected at a second synchronous angle, wherein the first synchronous angle and the second synchronous angle are π degrees apart; and
   detecting failure of the switching device in the predetermined leg by determining an asymmetry ratio of the maximum value and the minimum value on a single phase of the phase current.

5. The method of claim 4, further comprising:
   storing the maximum value and the minimum value of the phase current.

6. The method of claim 4, wherein the failure of the switching device is detected when a difference between the maximum value and the minimum value is smaller than a predetermined level.

7. The method of claim 4, further comprising:
   displaying information related to the detection of the failure of the switching device.

\* \* \* \* \*